(12) United States Patent
Kuth et al.

(10) Patent No.: US 6,411,088 B1
(45) Date of Patent: Jun. 25, 2002

(54) MAGNETIC RESONANCE APPARATUS FOR OBTAINING A TRANSPARENCY IMAGE

(75) Inventors: Rainer Kuth, Herzogenaurach; Sabine Rupprecht; Thomas Rupprecht, both of Uttenrouth, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/522,419

(22) Filed: Mar. 9, 2000

(30) Foreign Application Priority Data

Mar. 10, 1999 (DE) .......................... 199 10 611
Feb. 18, 2000 (DE) .......................... 100 07 598

(51) Int. Cl.⁷ .............................. G01V 3/00
(52) U.S. Cl. .................. 324/307; 324/309; 324/318
(58) Field of Search .................. 324/307, 309, 324/318, 319, 321, 314; 600/410

(56) References Cited

U.S. PATENT DOCUMENTS

| 4,707,658 A | 11/1987 | Frahm et al. ................ 324/309 |
| 4,748,409 A | * 5/1988 | Frahm et al. ................ 324/309 |
| 4,769,603 A | 9/1988 | Oppelt et al. ................ 324/309 |
| 5,423,315 A | * 6/1995 | Margosian et al. .......... 600/410 |
| 5,821,751 A | 10/1998 | Wendt et al. ................ 324/307 |
| 5,926,021 A | 7/1999 | Hennig ........................ 600/410 |

OTHER PUBLICATIONS

Stewart C. Bushong "Magnetic Resonance Imaging Physical and Biological Principles" Second Edition textbook published by Mosby 1996 pp. 110–113.*

"Remember True FISP? A High SNR Near 1–Second Imaging Method for T2–Like Contrast in Interventional MRI at .2T," Durek et al., J. Mag. Res. Imaging, vol. 8, No. 1 (1998), pp. 203–208.

* cited by examiner

Primary Examiner—Edward Lefkowitz
Assistant Examiner—Tiffany A. Fetzner
(74) Attorney, Agent, or Firm—Schiff Hardin & Waite

(57) ABSTRACT

For purposes of producing a transparency image in a transparency direction, a magnetic resonance device includes a basic field magnetic system for generating a basic magnetic field that exhibits a high homogeneity and a low flux density in at least one imaging volume, and an arrangement for executing a refocused gradient echo sequence, wherein two gradient fields, respectively oriented perpendicularly to the transparency direction, can be switched without slice selection, or for executing a refocused gradient echo sequence with a large slice thickness in the transparency direction.

42 Claims, 2 Drawing Sheets

MAGNETIC RESONANCE APPARATUS FOR OBTAINING A TRANSPARENCY IMAGE

BACKGROUND OF THE INVENTION

1. Field of the Invention

The present invention is directed to a magnetic resonance device which is able to obtain a transparency image of an examination subject. As used herein, the term "transparency image" means an image which simulates a radiographic image produced by penetrating radiation, i.e., all organs are superimposed in the image and are visible dependent on their respective radiographic transparency. The term "transparency direction" means the direction from which the image is "seen," which, in the context of a radiographic image, would be the direction of propagation of the penetrating radiation.

2. Description of the Prior Art

Magnetic resonance tomography device is a known technique for generating images of the inside of a body of an examination subject. For that purpose, rapidly switched gradient fields, which are generated by a gradient coil system, are superimposed onto a static basic magnetic field, which is generated by a basic field magnetic system, in a magnetic resonance tomography device. Further, the magnetic resonance tomography device has a high frequency system, which, for producing magnetic resonance signals, radiates high frequency signals into the examination subject and picks up the generated magnetic resonance signals on the basis of which magnetic resonance images are prepared.

Magnetic resonance tomography devices have been clinically utilized in an increasing extent since 1983. Due to the extremely high initial cost and operating expenses, as well as due to the extremely long measuring periods, magnetic resonance tomography was initially reserved for specific clinical examinations in the area of the central nervous system. Although magnetic resonance tomography currently is clearly the image-diagnostic method of choice for many different pathologies, magnetic resonance tomography still is a last resort, if used at all, for most everyday diagnostic imaging, since the initial cost is still high and the measuring periods are comparatively long. Currently, X-ray devices are mainly utilized as a first imaging modality within the clinical routine for answering everyday questions. Such clinical everyday questions are examinations of the inner organs, such as the lung. A contrast representation (shadow image) of an organ or of an entire body section is most commonly produced.

Since its introduction, further developments in the field of the magnetic resonance tomography have had the goal as shortening measuring periods and improving the resolution and the contrast properties of the tomograms. For that purpose, the efficiency of the components of a magnetic resonance tomography device has increased with an increasing technical outlay.

Among other things, the reduction of measuring periods is the goal of several known measuring sequences. For example, U.S. Pat. No. 4,769,603 and an article by J. L. Duerk et al. "Remember True FISP? A High SNR Near 1-Second Imaging Method for T2-Like Contrast in Interventional MRI at 0.2T", vol. 8, No. 1, 1998, pages 203 through 208, describe a refocused gradient echo sequence by means of which magnetic resonance tomograms can be picked up with a high image contrast given a short measuring time, known by the acronym FISP, or True-FISP. Characteristic of the measuring sequence described in the above-cited documents is that a slice selection gradient is generated at the same time as a high frequency pulse for a duration T, a readout gradient and the slice selection gradient with reversed polarity are subsequently generated for a duration of approximately T/2, a readout gradient with reversed polarity is subsequently generated for a duration of approximately T, and these steps are multiply repeated. A dynamic equilibrium magnetization is maintained with a high frequency pulse sequence of high symmetry.

In addition to techniques, such as the above for imaging slices of an examination subject, volume imaging techniques are known for achieving high-quality magnetic resonance images from a magnetic resonance signal with a high signal-to-noise ratio. Apart from the frequency encoding, two phase encoding gradients are successively switched in two spacial directions that are orthogonal to one another in volume imaging. This requires a correspondingly efficient gradient system. Further, a dataset must be processed that is many times larger than for a slice, corresponding to an expansion in a third dimension. This requires increased efficiency in the measured value processing and in the image reconstruction, as well as an extended measuring time.

There is still a need to have an inexpensive magnetic resonance device for obtaining transparency images in order to replace, for example, X-ray-based devices, whose damaging effect on living tissue of patients as a result of the use of ionizing radiation is known for the everyday imaging purposes described above.

German PS 35 04 734 discloses a method for the fast pickup of slice tomograms with a high spacial resolution, which is a gradient version method with a small flip angle and a small high frequency output. The method is described as being particularly advantageous given high magnetic flux densities of a basic magnetic field that is generated by asuperconducting basic field magnetic system. In an embodiment of the method, a pickup of a transparency-like tomogram ensues without slice selection.

German OS 196 28 951 discloses a method for magnetic resonance angiography with which transparency-like angiograms can be picked up with a short measuring time and with a $T_1$-weighting. For that purpose, a contrast medium is injected into the pulsatile vessels to be imaged. In the pickup of the angiogram, either no slice selection takes place, or a thick slice is selected with a weak slice selection gradient, this slice encompassing the entire target volume. Among other things, a disadvantage of the above-cited methods is that transparency-like images of vessels that are filled with the contrast medium can be picked up. Visualization of anatomical structures in an environment of the vessels is not possible.

SUMMARY OF THE INVENTION

An object of the present invention is to provide a magnetic resonance device with which meaningful transparency images can be picked up with short measuring times, comparable to those obtained using X-ray devices, and which reduces above cited disadvantages of the prior art. As used herein, thus, a "meaningful transparency image" means an image having a diagnostic clarity and resolution comparable to an x-ray transparency.

This object is inventively achieved in that a magnetic resonance device for generating a transparency image in a selected direction, the device having basic field magnetic system for generating a basic magnetic field that exhibits a high homogeneity and a low magnetic flux density in an imaging volume, and a gradient coil system and a controller therefor, in a first version, executing a refocused gradient echo sequence, wherein two gradient fields, whose gradients are perpendicularly directed to the selected direction, can be switched. In a second version the controller executes a refocused gradient echo sequence with a large slice thickness in the selected direction.

In the literal sense, such a magnetic resonance device is not a tomography device wherein, for example, refocused gradient echo sequences are employed to image a slice having a slice thickness of a maximum of a few millimeters. Therefore the device is referred to as magnetic resonance transparency device in the following. The magnetic resonance transillumination device differs from devices that operate using the above cited volume technique not only because merely a simple phase encoding is required, but also because the dataset is many times smaller and the measuring time is many times shorter.

The invention is based on the recognition that transparency image, which is diagnostically extremely meaningful, since it is not distorted by artefacts, can be surprisingly obtained with a short measuring time by means of the combined action of the following four factors:

basic magnetic field of high homogeneity,
basic magnetic field of low magnetic flux density,
refocused gradient echo sequence, and
thick slice or no slice selection in the direction of the transparency "view".

The basic magnetic field of high homogeneity, on principle, causes few artefacts.

The basic magnetic field of low magnetic flux density effects small artefacts known as susceptibility artefacts, which are approximately directly proportional to the magnetic flux density of the basic magnetic field. The susceptibility artefacts arise at the border of two areas within an examination subject with different susceptibility properties. The largest susceptibility differences occur at air-tissue-borders and air-water-borders, which are typical for a lung, for example, and have hitherto prevented meaningful images of the lung using magnetic resonance. This is one reason earlier attempts, as discussed above, to obtain transparency images using magnetic resonance have only been able to produce images that are diagnostically meaningless, due to over-intense susceptibility artefacts, even in the most homogenous basic magnetic field of a high field magnetic resonance device with a magnetic flux density of 1.5 Tesla, for example.

An insight that has contributed to the present invention is that the transparency tomograms according to the above cited German PS 35 04 734 are almost without any diagnostic utility as a result of artefacts which occur due to an intense basic magnetic field overwhelming all other image contributions.

The paragraph beginning at page 6, line 13 has been amended as follows:

The refocused gradient echo sequence, for example according to the above cited U.S. Pat. No. 4,769,603 and/or according to the Duerk et al. article is appropriate for achieving $T_2$-weighted images or $T_2^*$-weighted images with good contrast properties and a short measuring time given (in contrast to the intense basic magnetic field of German PS 35 04 734) a low magnetic flux density of a basic magnetic field, in particular. As a result, a short measuring time and a high image frequency with a number of magnetic resonance images per second can be realized given high magnetic resonance image quality. This makes real-time examinations possible. A short measuring time is particularly important when a patient has to stop breathing during the measuring in order to avoid motion artefacts.

As a result of the thick slice selection or the absence of a slice selection in the direction of transparency according to the invention, an extremely large examination volume is responsible for the resonance signal with respect to the magnetic resonance transparency device in contrast to conventional magnetic resonance tomography, wherein the resonance signal arises from slices with thicknesses in the range of millimeters. This leads to a high signal intensity and therefore to a high signal-to-noise ratio. This (normally avoided) high signal-to-noise ratio, as a result of the basic magnetic field of low magnetic flux density, must be over-compensated. In contrast to a conventional tomogram, a magnetic resonance signal that is up to approximately 100 times more intense is available to the magnetic resonance transparency device when examining a thorax, for example. The magnetic resonance transparency device has a high frequency transmission stage and a high frequency reception stage, which is adjusted to the large resonance volume, for converting the high signal intensity and with a high signal-to-noise ratio into a qualitatively high-quality transparency image.

In the version of the inventive magnetic resonance transparency device wherein a refocused gradient echo sequence is employed, wherein two gradient fields that are perpendicularly oriented to the direction of the transparency are switchable, a slice selection in the direction of the transparency does not ensue, so that an entire thickness of an examination subject, in the transparency direction, is available as an extremely large examination volume. Therefore, a simple and inexpensive gradient system is usable. For example, an advantageous application is in the field of pediatrics, since the patients naturally have a relatively small volume. Further, substitution for comparable X-ray examinations is desirable especially in pediatrics, since ionizing radiation can have a particularly damaging effect on patients who are still growing. This latter is even more important when multiple examinations are necessary as are standard for pulmonary lung diseases, for example.

In a version of the inventive magnetic resonance transparency device wherein a refocused gradient echo sequence with a large slice thickness in the transparency direction is employed, the large slice thickness is greater than or equal to approximately 3 cm in a preferred embodiment. The thick slice in transparency direction can be achieved by means of a broadband high frequency pulse in connection with a weak slice selection gradient in transparency direction.

In a further embodiment, the slice thickness is on the order of magnitude of inner organs of a patient, which are to be examined. For example, disturbing influences on the image from peripheral fat and/or the peripheral areas of the body, which are situated in the area of poor basic magnetic field homogeneity, are thus suppressed. This is particularly advantageous when examining inner organs of adults.

In another embodiment, the magnetic flux density of the basic magnetic field is less than or equal to about 0.25 Tesla. Inexpensive permanent magnets and normally conducting (room temperature) electromagnets can be utilized as a result. It is not required to use technically complicated and expensive superconducting magnets.

In another advantageous embodiment, the basic field magnetic system is a switchable, normally conducting coil arrangement. The coil arrangement can be switched-on and switched off. Therefore, the basic magnetic field can be switched-on during data acquisition for magnetic resonance images and can be switched off during non-acquisition times. The basic field magnetic system can be fashioned with a simple cooling means or can be fashioned without a cooling means, since the coil arrangement can be switched on as required, so that there is little heat development in the coil arrangement. This produces a significant cost advantage.

In a further embodiment, the device is fashioned such that examination of a standing patient is facilitated. A high throughput of patients is therefore achieved. Lying down and standing up on the part of the subject is not necessary. This is particularly advantageous for series examinations.

In another embodiment, the magnetic resonance transparency device is fashioned such that at least parts of the device, which include the basic field magnetic system, are pivotably supported for rotation around at least one rotational axis. Thus, patients can be examined with the above cited advantages when standing and, after a corresponding pivoting, patients can also be examined when lying down, for example, infants, since an examination when standing is naturally not possible.

Figure 1:
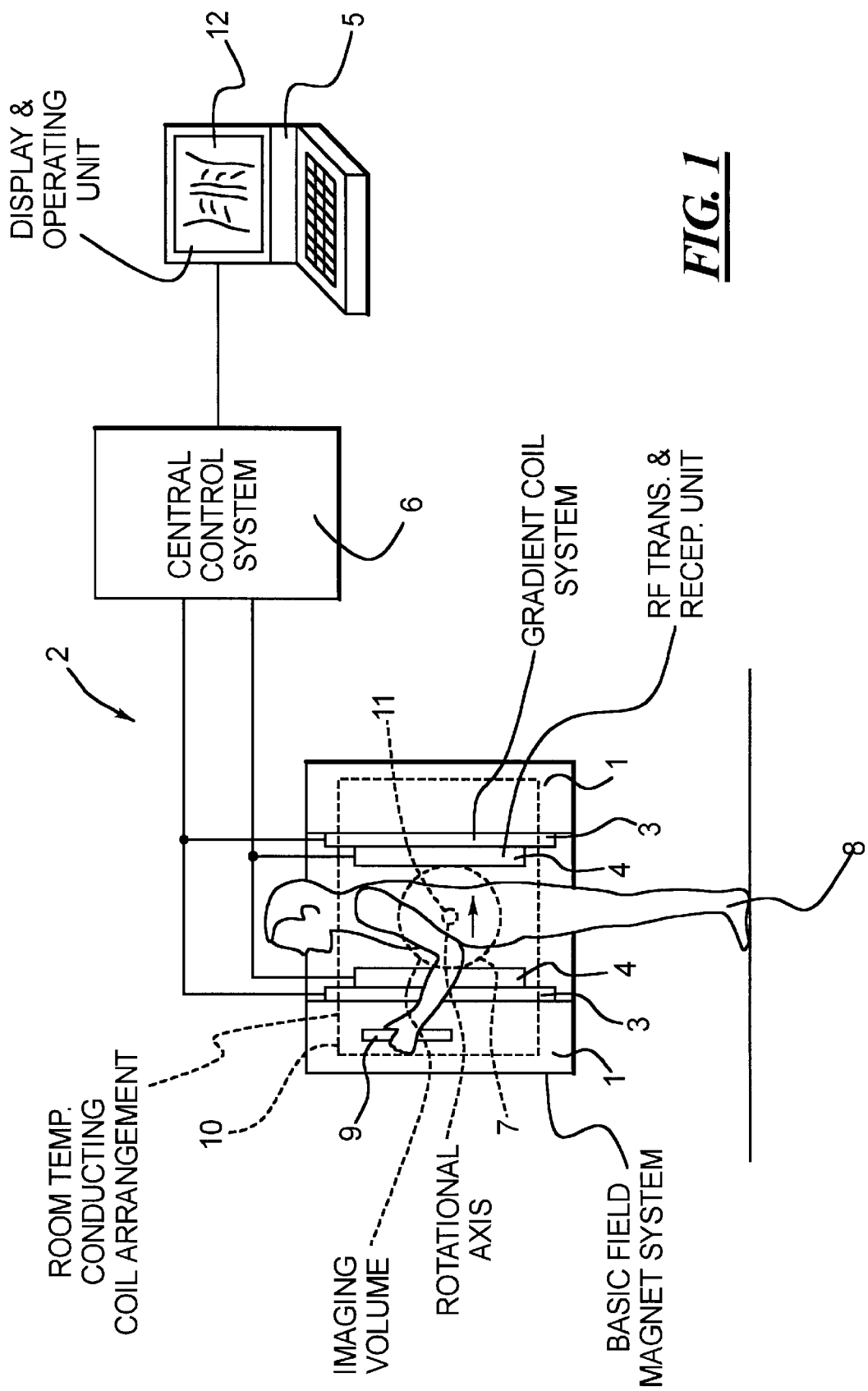
FIG. 1 is a schematic illustration of an exemplary embodiment of an inventive magnetic resonance transparency device.

The transparency device shown in FIG. 1 includes a basic field magnetic system 1, which is fashioned in a C-shaped manner and which is pivotably supported for rotation around a rotational axis 11 that is perpendicularly directed to the plane of the drawing, such as being fastened at a wall of a room, for example. The basic field magnetic system 1 includes a switchable, normally (room temperature) electrically conducting coil arrangement 10, for example. The basic field magnetic system 1 generates a static, homogeneous basic magnetic field in at least a spherical imaging volume 7, for example. In the pivot position of the basic field magnetic system shown in FIG. 1, the field lines of the basic magnetic field penetrate a patient 8 from the front, who enters in the opening of the C-profile for purposes of acquiring data for a transparency image. Corresponding handles 9 are present at the device, so that the patient 8 can stabilize himself or herself during data acquisition to avoid motion artefacts in the transparency image. The transparency direction is the same as the basic magnetic field direction in the example of FIG. 1, as indicated by the arrow. A pivot position of the basic field magnetic system 1, in which the patient 8, for example, an infant can be examined when lying down, is adjustable by rotating the basic field magnetic system 1 around the rotational axis 11 by approximately ±90°.

Further, the magnetic resonance device according to FIG. 1 has an arrangement, generally referenced 2, for acquiring data for transparency images by executing a refocused gradient echo sequence with a large slice thickness in a transparency direction. This arrangement 2 includes, for example, a gradient coil system 3, a radio-frequency transmission and a reception stage 4, a display and operating unit 5 and a central control system 6 that is connected to the gradient coil system 3, the radio-frequency transmission and reception stage 4 and the display and operating unit 5. The radio-frequency transmission and reception stage 4, which is matched to the large resonance volume, and the gradient coil system 3, are firmly connected to the pivotable basic field magnetic system 1. The refocused gradient echo sequence, for example a True-FISP sequence, is selectable at the display and operating unit 5 and the slice thickness in the transparency direction can be adjusted to be greater or equal to 3 cm, for example. The gradient coil system 3 and the high frequency transmission and reception stage 4 are controlled by the control system 6 in accordance with the selected measuring sequence. The gradient coil system 3, the radio-frequency transmission and reception stage 4, as well as the central control system 6 are fashioned such that a broadband high frequency pulse can be generated in connection with a weak slice selection gradient in the transparency direction for achieving a large slice thickness in the transparency direction. Further, the magnetic resonance signals that are picked up by the radio-frequency transmission and reception stage 4, in real-time, and are evaluated in the control system 6 and are converted into a corresponding transparency image 12 that is displayed at the display and operating unit 5.

Figure 2:
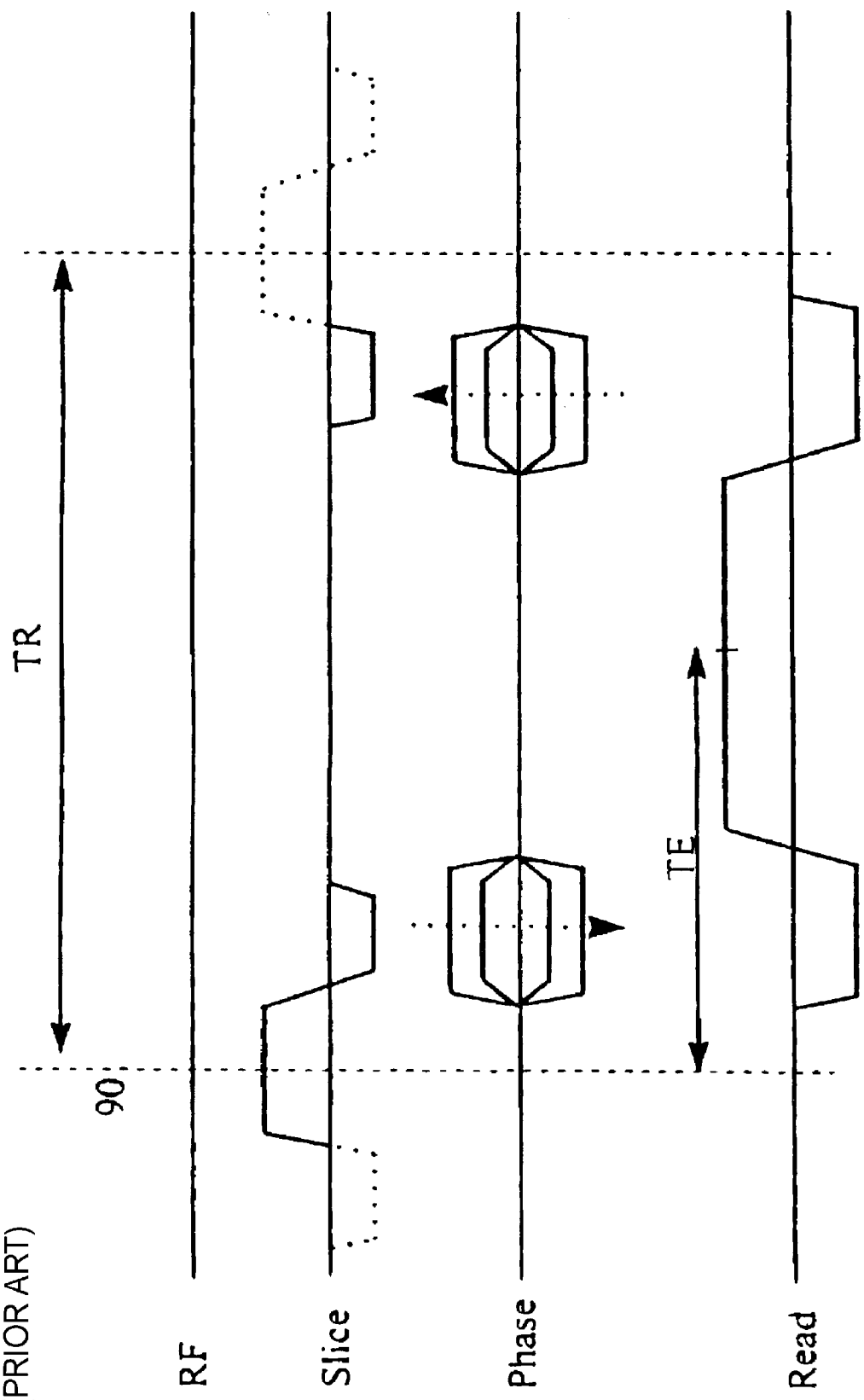
FIG. 2 illustrates a known True-FISP sequence suitable for use in the inventive magnetic resonance transparency device.

FIG. 2 schematically illustrates a conventional True-FISP sequence of the type suitable for use in the inventive device for producing a transparency image. This sequence is shown in the aforementioned Duerk et al. reference, and the details thereof are well-known to those of ordinary skill in the art and therefore need not be further explained herein. FIG. 2 shows the radio-frequency pulses (RF) schematically indicated with vertical dashed lines and separated by a repetition time TR, the slice selection gradient (Slice), the phase-encoding gradient (Phase), indicated as being stepped in opposite directions from repetition-to-repetition, and the readout gradient (Read), with the relaxation time TE indicated as well.

We claim as our invention:

1. A magnetic resonance transillumination apparatus comprising:
   a basic field magnet which generates a basic magnetic field having a high homogeneity and a low magnetic flux density, at least in an imaging volume; and
   a radio-frequency and gradient system for executing a refocused gradient echo sequence wherein two gradient fields are generated, which are respectively oriented perpendicularly to a transparency direction, and are switched in said sequence with no slice selection in said transparency direction to obtain a meaningful transparency image of an examination subject in said imaging volume in said transparency direction.

2. A magnetic resonance apparatus as claimed in claim 1 wherein said basic field magnetic system generates said basic magnetic field with a magnetic flux density which is less than or equal to approximately 0.25 T.

3. A magnetic resonance apparatus as claimed in claim 2 wherein said basic field magnetic system comprises a switchable, electrically conducting coil arrangement operating at room temperature.

4. A magnetic resonance apparatus as claimed in claim 1 wherein said basic field magnetic system generates said basic magnetic field with a homogeneity in said imaging volume of less than or equal to approximately 10 ppm.

5. A magnetic resonance apparatus as claimed in claim 4 wherein said basic field magnetic system comprises a switchable, electrically conducting coil arrangement operating at room temperature.

6. A magnetic resonance apparatus as claimed in claim 1 wherein said gradient system executes said refocused gradient coil sequence with a flip angle which is greater than 90°.

7. A magnetic resonance apparatus as claimed in claim 1 wherein said gradient system executes said refocused gradient echo sequence as a sequence selected from the group consisting of a FISP sequence and a True-FISP sequence.

8. A magnetic resonance apparatus as claimed in claim 1 wherein said gradient system executes said refocused gradient echo sequence as a sequence selected from the group consisting of $T_2$-weighted sequences and $T_2^*$-weighted sequences.

9. A magnetic resonance apparatus as claimed in claim 1 further comprising a support element and wherein said basic field magnetic system is pivotally mounted on said support element for rotation around a rotational axis.

10. A magnetic resonance apparatus as claimed in claim 1 wherein said basic field magnetic system and said gradient system are oriented for examining a standing examination subject.

11. A magnetic resonance transillumination apparatus comprising:
    a basic field magnet which generates a basic magnetic field having a high homogeneity and a low magnetic flux density, at least in an imaging volume; and
    a radio-frequency and gradient system for executing a refocused gradient echo sequence with a large slice thickness in a transparency direction for obtaining a meaningful transparency image of an examination subject in said imaging volume in said transparency direction.

12. A magnetic resonance apparatus as claimed in claim 11 wherein said gradient system executes said refocused gradient echo sequence with a slice thickness which is greater than or equal to approximately 3 cm.

13. A magnetic resonance apparatus as claimed in claim 11 wherein said examination subject contains an organ, having an organ thickness, which is to be imaged in said transparency image, and wherein said gradient system executes said refocused gradient echo sequence with a slice thickness approximately equal to said organ thickness.

14. A magnetic resonance apparatus as claimed in claim 11 wherein said patient has a dimension along said transparency direction, and wherein said gradient system executes said refocused gradient echo sequence with a slice thickness approximately equal to said dimension.

15. A magnetic resonance apparatus as claimed in claim 11 wherein said basic field magnetic system generates said basic magnetic field with a magnetic flux density which is less than or equal to approximately 0.25 T.

16. A magnetic resonance apparatus as claimed in claim 15 wherein said basic field magnetic system comprises a switchable, electrically conducting coil arrangement operating at room temperature.

17. A magnetic resonance apparatus as claimed in claim 11 wherein said basic field magnetic system generates said basic magnetic field with a homogeneity in said imaging volume of less than or equal to approximately 10 ppm.

18. A magnetic resonance apparatus as claimed in claim 17 wherein said basic field magnetic system comprises a switchable, electrically conducting coil arrangement operating at room temperature.

19. A magnetic resonance apparatus as claimed in claim 11 wherein said gradient system executes said refocused gradient coil sequence with a flip angle which is greater than 90°.

20. A magnetic resonance apparatus as claimed in claim 11 wherein said gradient system executes said refocused gradient echo sequence as a sequence selected from the group consisting of a FISP sequence and a True-FISP sequence.

21. A magnetic resonance apparatus as claimed in claim 11 wherein said gradient system executes said refocused gradient echo sequence as a sequence selected from the group consisting of $T_2$-weighted sequences and $T_2^*$-weighted sequences.

22. A magnetic resonance apparatus as claimed in claim 11 further comprising a support element and wherein said basic field magnetic system is pivotally mounted on said support element for rotation around a rotational axis.

23. A magnetic resonance apparatus as claimed in claim 11 wherein said basic field magnetic system and said gradient system are oriented for examining a standing examination subject.

24. A method for operating a magnetic resonance transillumination apparatus comprising the steps of:
    generating a basic magnetic field having a high homogeneity and a low magnetic flux density, at least in an imaging volume; and
    obtaining a meaningful transparency image of an examination subject in said imaging volume in a transparency direction by executing a refocused gradient echo sequence wherein two gradient fields are generated, which are respectively oriented perpendicularly to said transparency direction, and are switched in said sequence, with no slice selection in said transparency direction.

25. A method as claimed in claim 24 comprising generating said basic magnetic field with a magnetic flux density which is less than or equal to approximately 0.25 T.

26. A method as claimed in claim 25 comprising generating said basic magnetic field with a switchable, electrically conducting coil arrangement operating at room temperature.

27. A method as claimed in claim 24 comprising generating said basic magnetic field with a homogeneity in said imaging volume of less than or equal to approximately 10 ppm.

28. A method as claimed in claim 27 comprising generating said basic magnetic field with a switchable, electrically conducting coil arrangement operating at room temperature.

29. A method as claimed in claim 24 comprising executing said refocused gradient coil sequence with a flip angle which is greater than 90°.

30. A method as claimed in claim 24 comprising executing said refocused gradient echo sequence as a sequence selected from the group consisting of a FISP sequence and a True-FISP sequence.

31. A method as claimed in claim 24 comprising executing said refocused gradient echo sequence as a sequence selected from the group consisting of $T_2$-weighted sequences and $T_2^*$-weighted sequences.

32. A method for operating a magnetic resonance transillumination apparatus comprising the steps of:
    generating a basic magnetic field having a high homogeneity and a low magnetic flux density, at least in an imaging volume; and
    obtaining a meaningful transparency image of an examination subject in said imaging volume in a transparency direction by executing a refocused gradient echo sequence with a large slice thickness in said transparency direction.

33. A method as claimed in claim 32 comprising executing said refocused gradient echo sequence with a slice thickness which is greater than or equal to approximately 3 cm.

34. A method as claimed in claim 33 wherein said examination subject contains an organ, having an organ thickness, which is to be imaged in said transparency image, and comprising executing said refocused gradient echo sequence with a slice thickness approximately equal to said organ thickness.

35. A method as claimed in claim 32 wherein said patient has a dimension along said transparency direction, and comprising executing said refocused gradient echo sequence with a slice thickness approximately equal to said dimension.

36. A method as claimed in claim 32 comprising generating said basic magnetic field with a magnetic flux density which is less than or equal to approximately 0.25 T.

37. A method as claimed in claim 36 comprising generating said basic magnetic field comprises a switchable, electrically conducting coil arrangement operating at room temperature.

38. A method as claimed in claim 32 comprising generating said basic magnetic field with a homogeneity in said imaging volume of less than or equal to approximately 10 ppm.

39. A method as claimed in claim 38 comprising generating said basic magnetic field with a switchable, electrically conducting coil arrangement operating at room temperature.

40. A method as claimed in claim 32 comprising executing said refocused gradient coil sequence with a flip angle which is greater than 90°.

41. A method as claimed in claim 32 comprising executing said refocused gradient echo sequence as a sequence selected from the group consisting of a FISP sequence and a True-FISP sequence.

42. A method as claimed in claim 32 comprising executing said refocused gradient echo sequence as a sequence selected from the group consisting of $T_2$weighted sequences and $T_2^*$-weighted sequences.

* * * * *